(12) United States Patent
Lee (10) Patent No.: US 8,829,595 B2
(45) Date of Patent: Sep. 9, 2014

(54) 3-DIMENSIONAL NON-VOLATILE MEMORY DEVICE, MEMORY SYSTEM INCLUDING THE SAME, AND METHOD OF MANUFACTURING THE DEVICE

(75) Inventor: Dong Kee Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 12 days.

(21) Appl. No.: 13/600,034

(22) Filed: Aug. 30, 2012

(65) Prior Publication Data

US 2013/0161724 A1 Jun. 27, 2013

(30) Foreign Application Priority Data

Dec. 22, 2011 (KR) .......................... 10-2011-0140193

(51) Int. Cl.
*H01L 29/792* (2006.01)
*H01L 21/28* (2006.01)

(52) U.S. Cl.
USPC ................... 257/324; 438/591; 257/E29.262; 257/E29.309; 257/E21.21

(58) Field of Classification Search
USPC ............. 257/324, E29.262, E29.309, E21.21; 438/591
See application file for complete search history.

(56) References Cited

U.S. PATENT DOCUMENTS

| 8,377,817 | B2 * | 2/2013 | Park et al. ...................... 438/618 |
| 8,450,176 | B2 * | 5/2013 | Son et al. ...................... 438/261 |
| 2010/0034028 | A1 | 2/2010 | Katsumata et al. | |
| 2012/0049267 | A1 * | 3/2012 | Jung ............................. 257/324 |

FOREIGN PATENT DOCUMENTS

KR 1020100075098 7/2010

* cited by examiner

*Primary Examiner* — Matthew W Such
*Assistant Examiner* — Monica D Harrison
(74) *Attorney, Agent, or Firm* — IP & T Group LLP (57) ABSTRACT

A 3-dimensional non-volatile memory device, a memory system including the same, and a method of manufacturing the same comprise vertical channel layers protruding from a substrate, a plurality of interlayer insulating layers and a plurality of conductive layers alternately formed along the vertical channel layers, a charge trap layer surrounding the vertical channel layers, the charge trap layer having a smaller thickness in a plurality of first regions, interposed between the plurality of conductive layers and the vertical channel layers, than in a plurality of second regions, interposed between the plurality of interlayer insulating layers and the vertical channel layers and a blocking insulating layer formed in each of the plurality of first regions, between the plurality of conductive layers and the charge trap layer.

18 Claims, 9 Drawing Sheets

2-DIMENSIONAL NON-VOLATILE MEMORY DEVICE, MEMORY SYSTEM INCLUDING THE SAME, AND METHOD OF MANUFACTURING THE DEVICE

CROSS-REFERENCE TO RELATED APPLICATION

This application claims priority to and the benefit of Korean Patent Application No. 10-2011-0140193, filed on Dec. 22, 2011 the disclosure of which is incorporated herein by reference in its entirety.

BACKGROUND

The present invention relates to a semiconductor device and a method of manufacturing the same. More specifically, the present invention relates to a 3-dimensional non-volatile memory device, a memory system including the same, and a method of manufacturing the device.

The development of semiconductor memory devices is showing a tendency toward increasing integration density and storing a high capacity of data. Since a typical 2-dimensional memory device is arranged on a semiconductor substrate in a row direction, a semiconductor substrate having an even larger area may be required to store a high capacity of data. However, as the integration density of 2-dimensional memory devices increases, interference and disturbance between adjacent devices may increase, thereby complicating multi-level cell (MLC) operations by which a high capacity of data may be easily stored. To overcome the restrictions of 2-dimensional memory devices, 3-dimensional memory devices are being developed.

In a 3-dimensional memory device, memory cells, which used to be conventionally arranged only in row directions, may be stacked in a direction perpendicular to a semiconductor substrate. Thus, the 3-dimensional memory device may have a high integration density and embody a large data capacity as compared with a 2-dimensional memory device.

Memory cells of a 3-dimensional memory device may include a plurality of conductive layers and a plurality of interlayer insulating layers, which are alternately stacked, and a vertical channel layer configured to penetrate the plurality of conductive layers and the plurality of interlayer insulating layers. In recent years, various techniques for improving the reliability of the 3-dimensional memory devices have been proposed.

SUMMARY OF THE INVENTION

The present invention is directed to a 3-dimensional non-volatile memory device, a memory system including the same, and a method of manufacturing the device, which may improve the integration density and reliability of semiconductor memory devices.

One aspect of the present invention provides a 3-dimensional non-volatile memory device including: vertical channel layers protruding from a substrate; a plurality of interlayer insulating layers and a plurality of conductive layers alternately formed along the vertical channel layers; a charge trap layer surrounding the vertical channel layers, the charge trap layer having a smaller thickness in a plurality of first regions, interposed between the plurality of conductive layers and the vertical channel layers, than in a plurality of second regions, interposed between the plurality of interlayer insulating layers and the vertical channel layers; and a blocking insulating layer formed in each of the plurality of first regions, between the plurality of conductive layers and the charge trap.

Another aspect of the present invention provides a memory system including: a 3-dimensional non-volatile memory device, comprising vertical channel layers protruding from a substrate, interlayer insulating layers and conductive layers alternately formed along the vertical channel layers, a charge trap layer surrounding the vertical channel layers, the charge trap layer having a smaller thickness in a plurality of first regions, interposed between the conductive layers and the vertical channel layers, than in a plurality of second regions, interposed between the interlayer insulating layers and the vertical channel layers, and a blocking insulating layer formed in each of the plurality of first regions, between the conductive layers and the charge trap layer; and a memory controller to control the 3-dimensional non-volatile memory device.

Another aspect of the present invention provides a method of manufacturing a 3-dimensional non-volatile memory device, the method including: alternately forming first interlayer insulating layers and first sacrificial layers on a substrate; forming channel holes, in the first interlayer insulating layers and first sacrificial layers, by etching the first interlayer insulating layers and the first sacrificial layers; sequentially forming a charge trap layer and a tunnel insulating layer on sidewalls of the channel holes; forming channel layers on each of the tunnel insulating layers; forming slits, in the first interlayer insulating layers and first sacrificial layers, by etching the first interlayer insulating layers and the first sacrificial layers; removing the first sacrificial layers exposed on inner walls of the slits; forming blocking insulating layers by oxidizing portions of the charge trap layers, exposed by removing the first sacrificial layers, to less than a full thickness of the charge trap layers; and forming conductive layers on each of the blocking insulating layers.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

The present invention will be described more fully hereinafter with reference to the accompanying drawings, in which exemplary embodiments of the invention are shown. This invention may, however, be embodied in different forms and should not be construed as limited to the embodiments set forth herein. Rather, these exemplary embodiments are provided so that this disclosure is thorough and complete and fully conveys the scope of the present invention to one skilled in the art.

Figure 1:
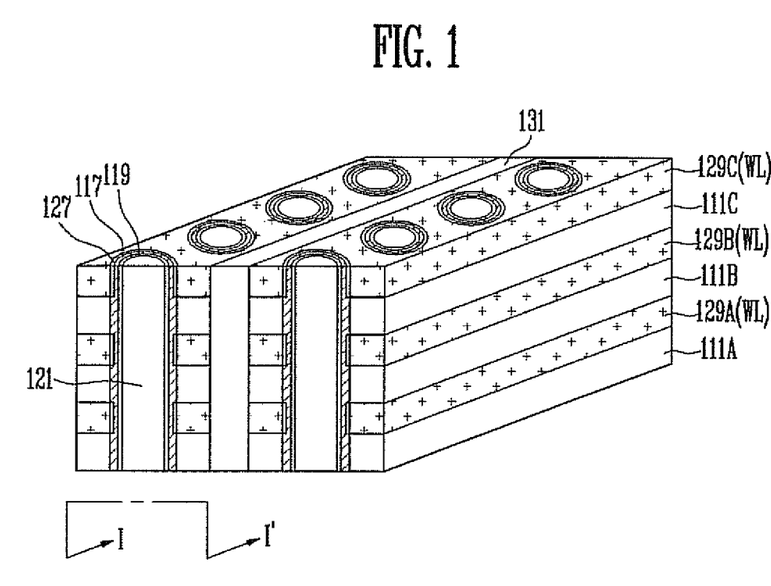
FIG. 1 is a perspective view of a portion of a 3-dimensional non-volatile memory device according to an exemplary embodiment of the present invention.

FIG. 1 is a perspective view of a portion of a 3-dimensional non-volatile memory device according to an exemplary embodiment of the present invention.

Referring to FIG. 1, the 3-dimensional non-volatile memory device according to the exemplary embodiment of the present invention may include vertical channel layers 121, which may protrude upward from a substrate (not shown) and constitute a matrix including a plurality of rows and a plurality of columns. Each of the vertical channel layers 121 may have a tube shape having a central portion filled with an insulating layer or have a pillar shape having a surface and central portion formed of a semiconductor material layer. FIG. 1 illustrates the pillar-shaped vertical channel layers 121.

An outer wall of each of the vertical channel layers 121 may be surrounded with a tunnel insulating layer 119. The tunnel insulating layer 119 may be surrounded with a charge trap layer 117 for storing charges.

The charge trap layer 117 may be surrounded with a plurality of interlayer insulating layers 111A to 111C stacked alternately. The plurality of interlayer insulating layers 111A to 111C may be separated by an insulating layer 131 that may penetrate the plurality of interlayer insulating layers 111A to 111C between two adjacent columns of vertical channel layers 121 and extend in a column direction. Conductive layers 129A to 129C for word lines WL may be formed between adjacent ones of the interlayer insulating layers 111A to 111C.

In particular, a blocking insulating layer 127, configured to cut off the transport of charges, may be formed between the conductive layers 129A to 129C and the charge trap layer 117. The blocking insulating layer 127 may not be formed between the conductive layers 129A to 129C and the interlayer insulating layers 111A to 111C. Accordingly, the conductive layers 129A to 129C and the interlayer insulating layers 111A to 111C may reduce the height of the stack structure.

Memory cell transistors may be defined at intersections between the word lines WL and the vertical channel layers 121. According to the above-described structure, the memory cell transistors according to an exemplary embodiment of the present invention may be stacked along the vertical channel layers 121 and 3-dimensionally arranged.

The conductive layers 129A to 129C may be formed of a polysilicon (poly-Si) layer or a material layer having a lower resistance than the poly-Si layer and a large work function. For example, the conductive layers 129A to 129C may be formed of tungsten (W). When the conductive layers 129A to 129C are formed of a material layer having a large work function, the back tunneling of charges through the blocking insulating layer 127 toward the charge trap layer 117 may be reduced. When the back tunneling of charges is reduced, the retention characteristic of memory cells may be improved.

Furthermore, the interlayer insulating layers 111A to 111C and the conductive layers 129A to 129C may be stacked in a direction perpendicular to a semiconductor substrate and constitute a string. A conductive layer formed on the string may be a drain selection line a conductive layer formed under the string may be a source selection line SSL, and the remaining conductive layers interposed between the drain selection lines DSL and the source selection lines may be word lines. Alternatively, when the two strings are connected in a U-shape, upper conductive layers may be drain selection lines DSL, and a source selection line SSL may be connected to the bottom of the U-shaped string.

A method of manufacturing the 3-dimensional non-volatile memory device, having the above-described structure, will now be described with reference to the cross-sectional view taken along the direction I-I'.

FIGS. 2A through 2F are cross-sectional views illustrating a method of manufacturing a 3-dimensional non-volatile memory device according to an exemplary embodiment of the present invention.

Figure 2A:
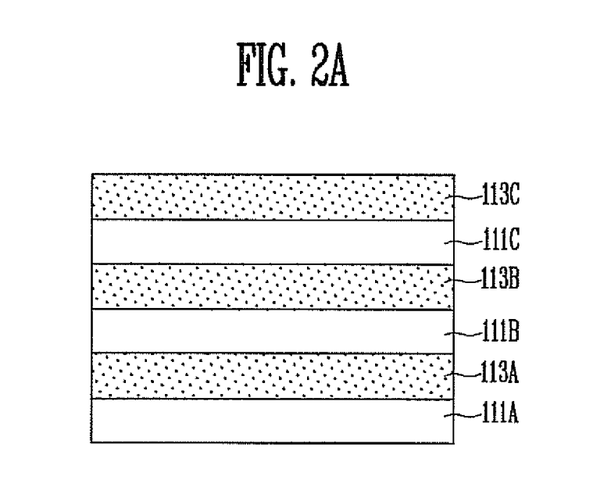
FIGS. 2A through 2F are cross-sectional views illustrating a method of manufacturing a 3-dimensional non-volatile memory device according to an exemplary embodiment of the present invention.

Referring to FIG. 2A, a plurality of interlayer insulating layers 111A to 111C and a plurality of sacrificial layers 113A to 113C may be alternately stacked on a substrate including an underlying structure (not shown). A description of the substrate including the underlying structure will be presented later with reference to FIGS. 3A through 3E.

The interlayer insulating layers 111A to 111C may be insulating layers configured to electrically insulate and isolate subsequent conductive layers from one another. The interlayer insulating layers 111A to 111C may be formed of, for example, an oxide layer. The sacrificial layers 113A to 113C may be formed where word lines will be formed. The sacrificial layers 113A to 113C may be formed of a material having an etch selectivity that is different than an etch selectivity of the interlayer insulating layers 111A to 111C. In particular, the sacrificial layers 113A to 113C may be formed of a material having an etch selectivity that is higher than an etch selectivity of the materials that forms the interlayer insulating layers 111A to 111C and the charge trap layer (refer to 117 of FIG. 2C). Therefore, damage to the interlayer insulating layers 111A to 111C and the charge trap layer 117 can be minimized during subsequent removal of the sacrificial layers 113A to 113C. For instance, the sacrificial layers 113A to 113C may be formed of a poly-Si layer.

Figure 2B:
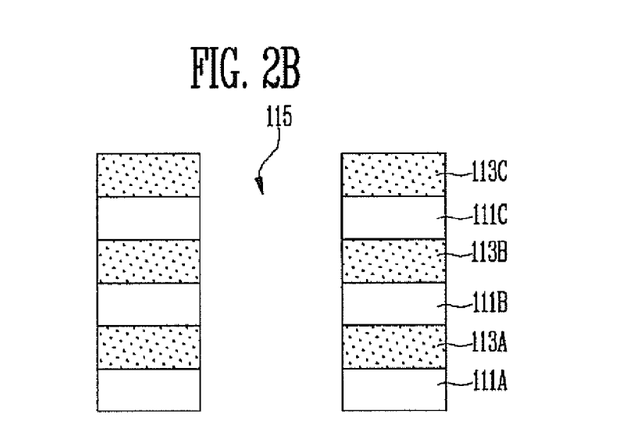

Referring to FIG. 2B, portions of the plurality of interlayer insulating layers 111A to 111C and the sacrificial layers 113A to 113C may be etched, thereby forming a plurality of channel holes 115 through the plurality of interlayer insulating layers 111A to 111C and the sacrificial layers 113A to 113C.

Figure 2C:
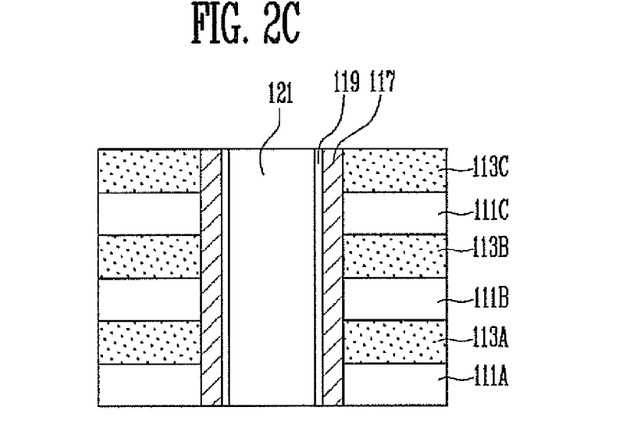

Referring to FIG. 2C, the charge trap layer 117, the tunnel insulating layer 119, and the channel layer 121 may be sequentially formed on sidewalls of the channel holes 115. For example, the charge trap layer 117 may be formed of a charge storage material, for example, a nitride layer. The tunnel insulating layer 119 may be formed of a tunnel insulating material, such as an oxide layer. The channel layer 121 may be formed of, for example, a poly-Si layer.

Figure 2D:
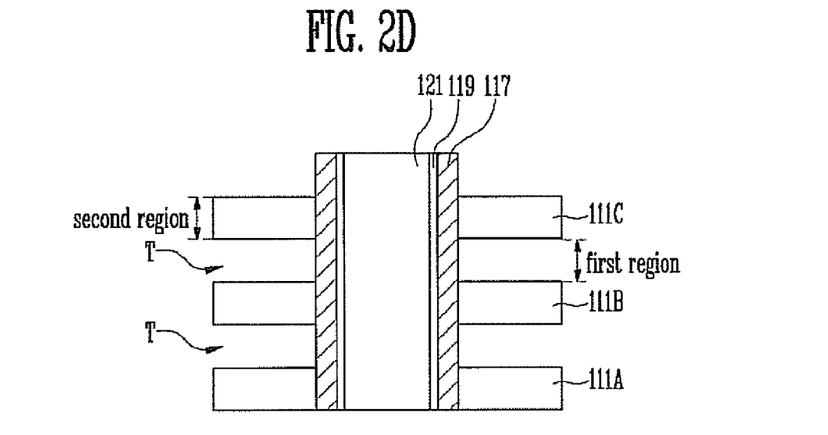

Referring to FIG. 2D, after forming at least one slit (not shown) between the channel holes 115, the sacrificial layers 113A to 113C exposed between slits may be removed using an etching process. Thus, trenches T may be formed in a first region between adjacent ones of the interlayer insulating layers 111A to 111C, and the interlayer insulating layers 111A to 111C may remain in the remaining second region. Since the interlayer insulating layers 111A to 111D and the sacrificial layers 113A to 113C are formed of materials having different etch selectivities, the sacrificial layers 113A to 113C may be selectively etched by to an etchant.

Figure 2E:
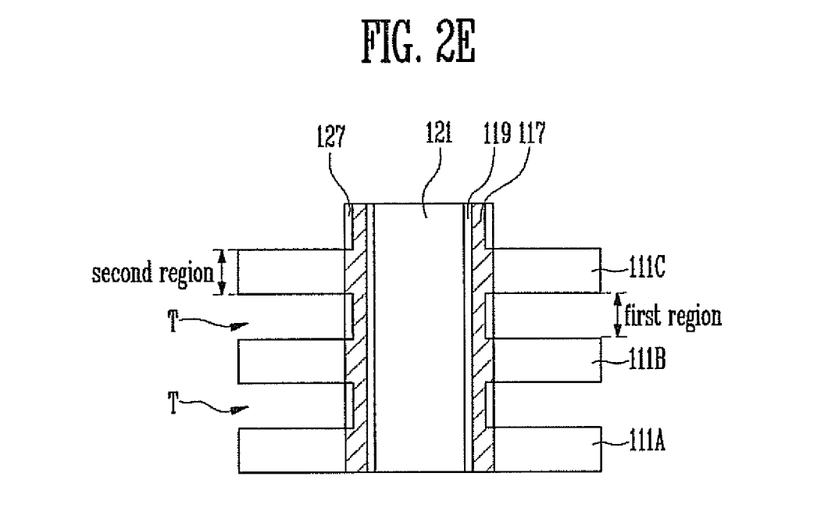

Referring to FIG. 2E, portions of the charge trap layer 117 exposed within the trenches T may be modified into blocking insulating layers 127 using an oxidation process. In particular, the oxidation process may be performed until a thickness of the exposed portions of the charge trap layer 117 is partially oxidized. Accordingly, the charge trap layer 117 disposed in the first region may have a smaller thickness than the charge trap layer 117 disposed in the second region.

When the blocking insulating layers 127 are formed by oxidizing the portions of the charge trap layer 117, the entire thickness may be easily reduced as compared with a case in which the charge trap layer 117 and the blocking insulating layer 127 are stacked.

Figure 2F:
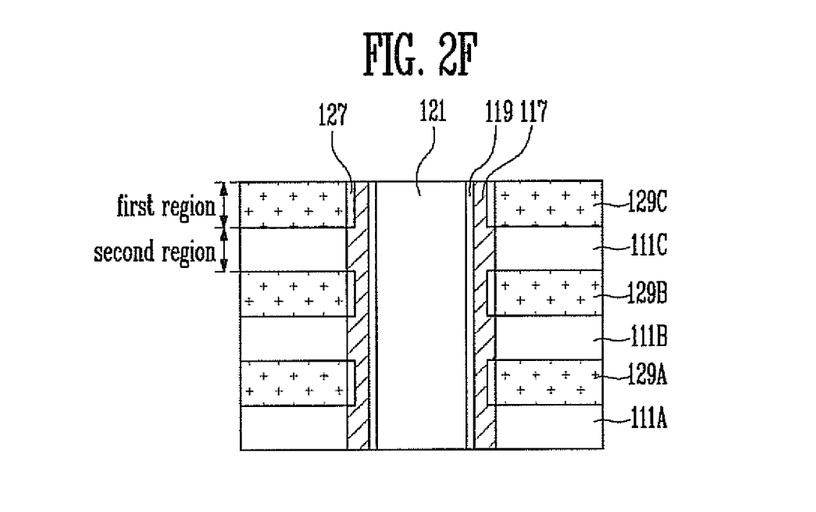

Referring to FIG. 2F, the conductive layers 129A to 129C may be formed to completely fill the trenches T. The conductive layers 129A to 129C may be formed of a poly-Si layer or a material layer having a lower resistance than the poly-Si layer and a large work function. For example, the conductive layers 129A to 129C may be formed of tungsten. When the conductive layers 129A to 129C are formed of a material layer having a large work function, the back tunneling of charges through the blocking insulating layers 127 toward the charge trap layer 117 may be reduced. When the back tunneling is reduced, the retention characteristic of memory cells may be increased, thereby improving the reliability of the memory device.

FIGS. 3A through 3E are cross-sectional views illustrating a 3-dimensional non-volatile memory device and a method of manufacturing the same, according to another exemplary embodiment of the present invention.

Figure 3A:
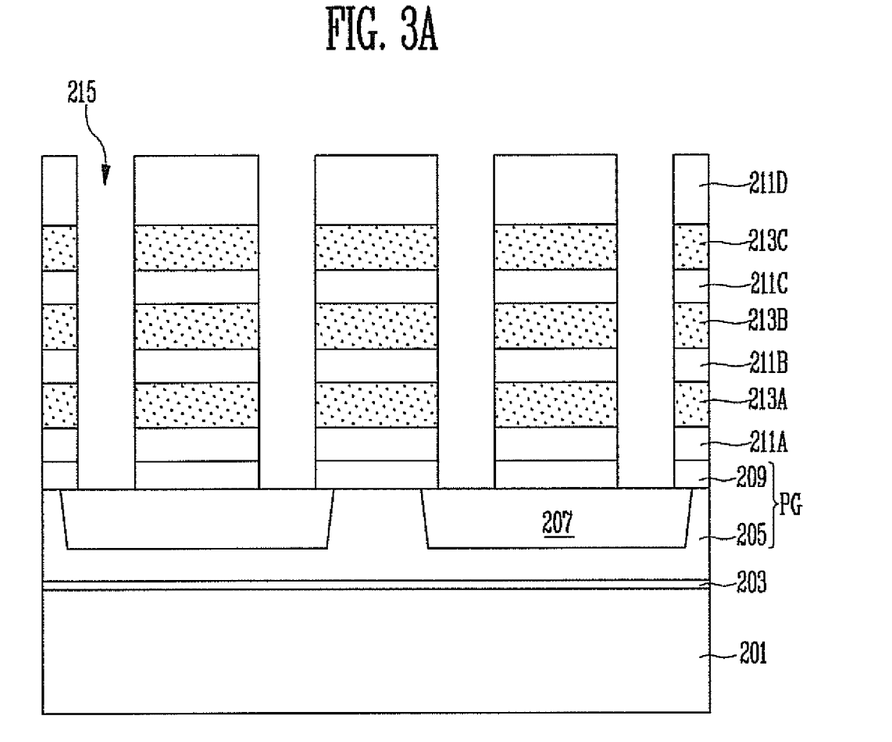
FIGS. 3A through 3E are cross-sectional views illustrating a 3-dimensional non-volatile memory device and a method of manufacturing the same, according to another exemplary embodiment of the present invention.

Referring to FIG. 3A, an interlayer insulating layer 203 may be formed on a substrate 201, and a first pipe gate layer 205 may be formed on an interlayer insulating layer 203. Afterwards, trenches may be formed in the first pipe gate layer 205 and filled with sacrificial layers 207. Thereafter, to strengthen an electric field applied to a pipe channel layer, a second pipe gate layer 209 may be formed on the sacrificial layers 207 and the first pipe gate layer 205. A pipe gate layer PG, including the first and second pipe gate layers 205 and 209, may be formed of poly-Si.

Subsequently, a plurality of interlayer insulating layers 211A to 211D and a plurality of sacrificial layers 213A to 213C may be alternately stacked on an underlying structure including the pipe gate layer PG filled with the sacrificial layers 207. Thereafter, portions of the plurality of interlayer insulating layers 211A to 211D and the plurality of sacrificial layers 213A to 213C may be etched to form a plurality of channel holes 215. Portions of both ends of each of the sacrificial layers 207 may be exposed by a pair of channel holes 215.

Figure 3B:
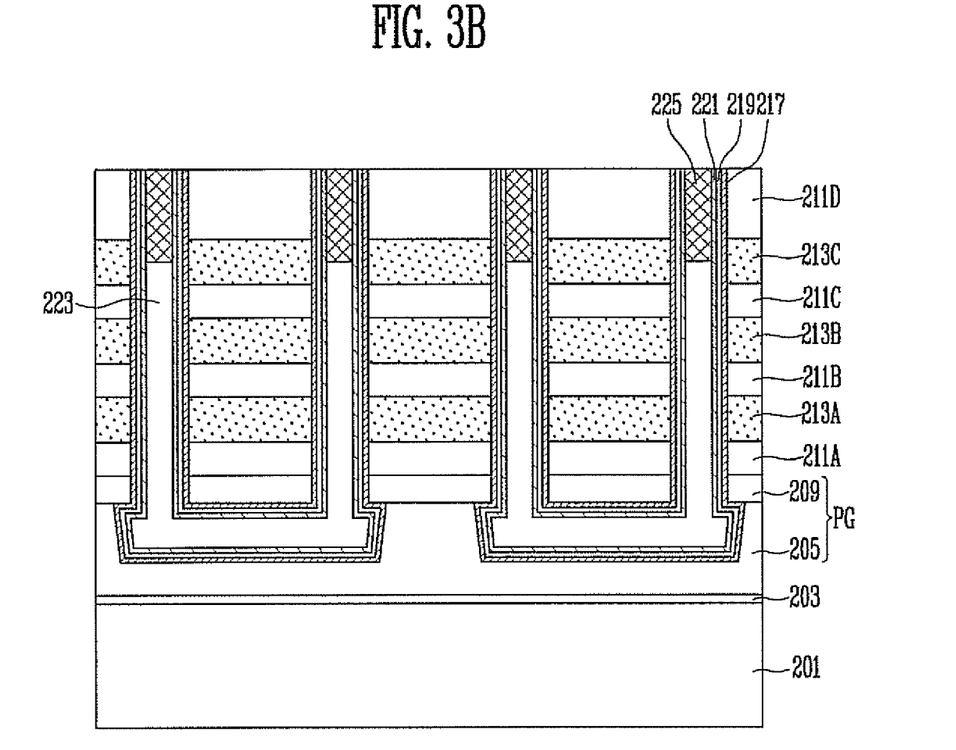

Referring to FIG. 3B, the sacrificial layers 207, which are exposed through the channel holes 215, may be removed using an etching process to expose surfaces of the pipe gate layer PG. Thereafter, a charge trap layer 217, configured to store charges, a tunnel insulating layer 219, and a channel layer 221 may be sequentially stacked along the exposed surfaces of the pipe gate layer PG and along the surfaces of the channel holes 215. The charge trap layer 217 may be formed of a charge storage material, for example, a nitride layer. The tunnel insulating layer 219 may be formed of a tunnel insulating material, such as an oxide layer. The channel layer 221 may be formed of, for example, a poly-Si layer. The charge trap layer 217, the tunnel insulating layer 219, and the channel layer 221 may be formed to such a thickness as not to completely fill the centers of the channel holes 215.

Thereafter, the channel holes 215 may be filled with insulating layers 223. The insulating layers 223 may be formed of an oxide layer to serve an electrical insulation function. To completely fill the insides of the channel holes 215, the insulating layers 223 may be formed of a flowable material, such as a spin on dielectric (SOD) layer. A portion of each of the insulating layers 223 may be removed to form a recess exposing upper surface of the channel layer 221. A capping layer 225 may be then formed within the recess. The capping layer 225 may be formed of a conductive material, as the capping layer 225 is used to reduce the resistance of the channel layer 221. For example, the capping layer 225 may be formed of a doped poly-Si layer.

Figure 3C:
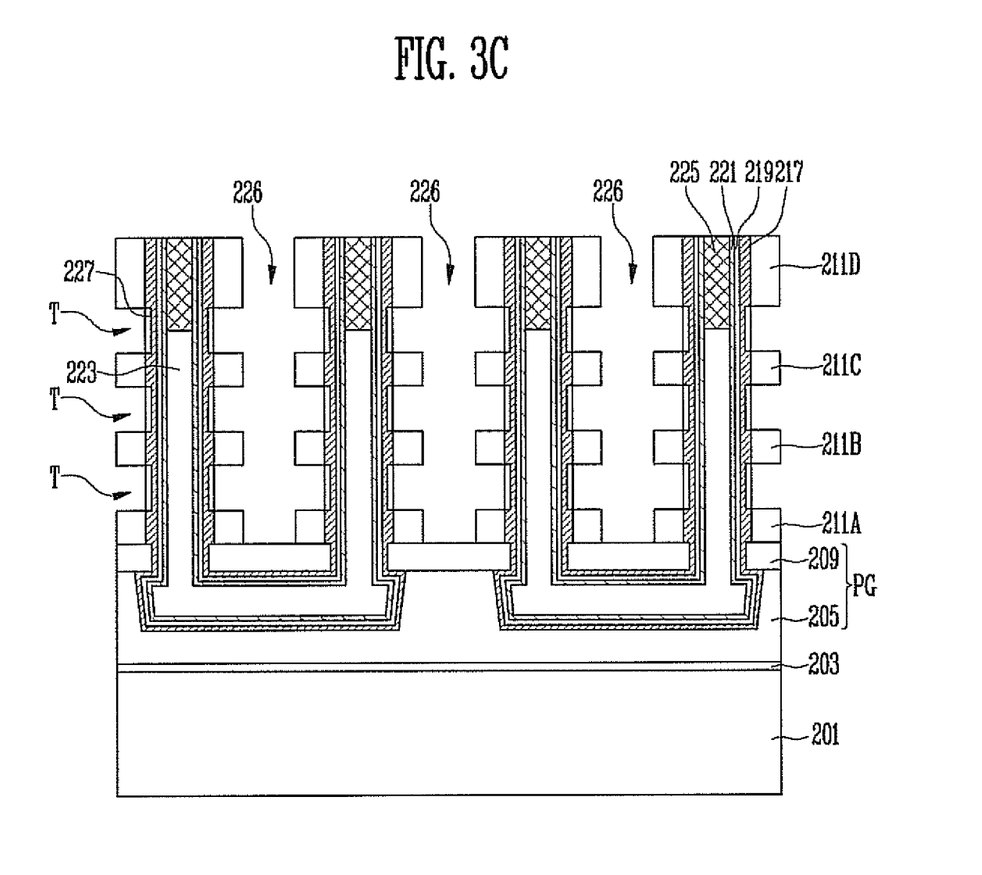

Referring to FIG. 3C, the plurality of interlayer insulating layers 211A to 211D and the sacrificial layers 213A to 213C, which may be formed between the vertical channel layers 221, may be etched to form slits 226. The slits 226 may be formed between adjacent columns of the vertical channel layers 221, in a column direction. As a result, sidewalls of the plurality of interlayer insulating layers 211A to 211D and the sacrificial layers 213A to 213C may be exposed by the slits 226.

Subsequently, the sacrificial layers 213A to 213C may be removed using an etching process. Thus, trenches T, which expose portions of the charge trap layer 217, may be formed between vertically adjacent ones of the interlayer insulating layers 211A to 211D. Since the interlayer insulating layers 211A to 211D and the sacrificial layers 213A to 213C are formed of materials having different etch selectivities, only the sacrificial layers 213A to 213C may be selectively etched by to an etchant.

Thereafter, the portions of the charge trap layer 216 exposed by the trenches T may be modified into blocking insulating layers 227 using an oxidation process. In particular, the oxidation process may be performed until a thickness of exposed portions of the charge trap layer 217 is partially oxidized. Thus, when the blocking insulating layers 227 are formed by oxidizing the exposed portions of the charge trap layer 217, the entire thickness may be easily reduced, as compared with a case in which the charge trap layer 217 and the blocking insulating layer 227 are stacked.

Figure 3D:
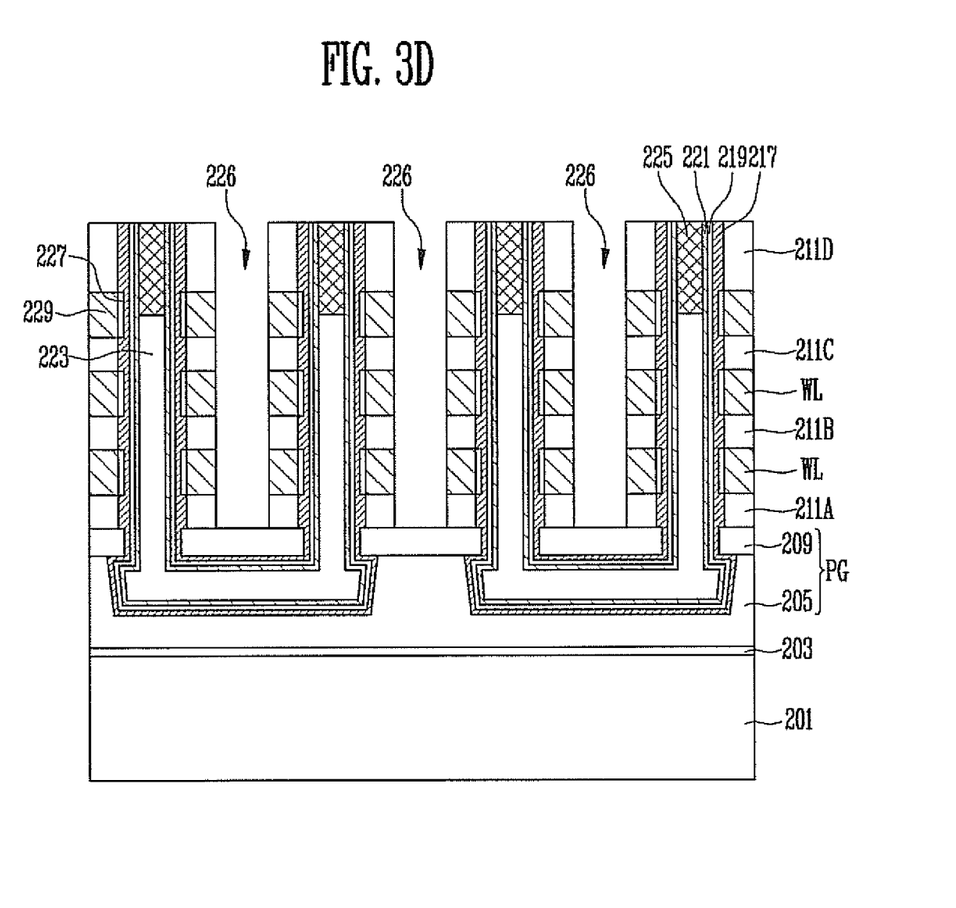
Figure 3E:
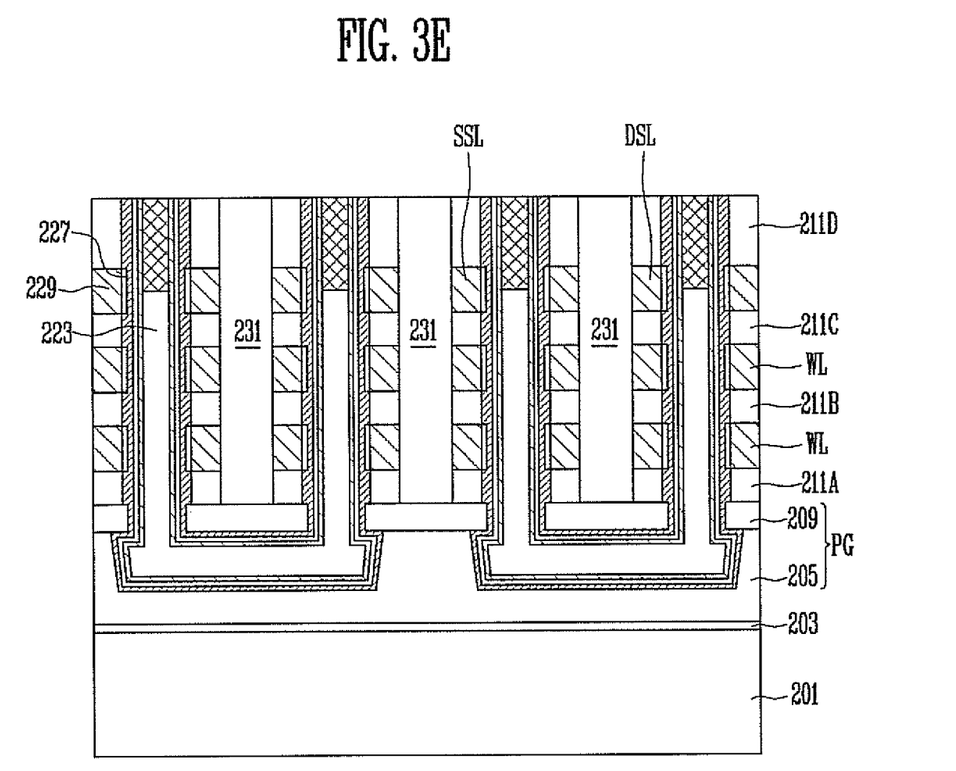

Referring to FIG. 3D, conductive layers 229 may be formed to completely fill the trenches T. The conductive layers 229 may be formed of a poly-Si layer or a material layer having a lower resistance than the poly-Si layer and a large work function. For example, the conductive layers 229 may be formed of tungsten. When the conductive layers 229 are formed of a material layer having a large work function, the back tunneling of charges through the blocking insulating layers 227 toward the charge trap layer 217 may be reduced. When the back tunneling is reduced, the retention characteristic of memory cells may be increased, thereby improving the reliability of the memory device. After that, the slits 226 may be filled with insulating layers 231, as shown in FIG. 3E.

At least one upper layer of the plurality of conductive layers 229 may be a drain selection line DSL or a source selection line SSL, and the remaining conductive layers may be word lines WL.

Figure 4:
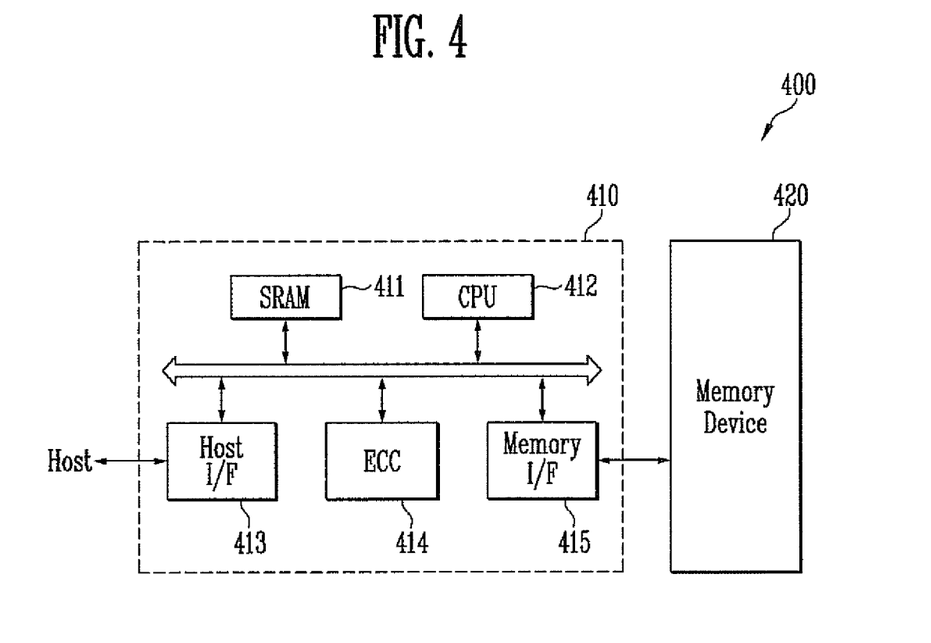
FIG. 4 is a schematic block diagram of a memory system according to an exemplary embodiment of the present invention.

FIG. 4 is a schematic block diagram of a memory system 400 according to an exemplary embodiment of the present invention.

Referring to FIG. 4, the memory system 400 according to the present invention may include a memory device 420 and a memory controller 410.

The memory device 420 may include at least one of the 3-dimensional non-volatile memory devices described above with reference to FIGS. 1 and 3E. That is, the memory device 420 may include a vertical channel layer protruding upward from a substrate, a tunnel insulating layer configured to surround the vertical channel layer, a charge trap layer configured to surround the tunnel insulating layer, a plurality of interlayer insulating layers stacked to be isolated from one another along the charge trap layer, a trench defined between the plurality of interlayer insulating layers, a conductive layer formed within the trench, and a blocking insulating layer formed between the conductive layer and the charge trap layer.

The memory controller 410 may control exchange of data between a host and the memory device 420. The memory controller 410 may include a processing unit 412 configured to control the overall operation of the memory system 400. Also, the memory controller 410 may include a static random access memory (SRAM) 411 used as an operation memory of the processing unit 412. Furthermore, the memory controller 410 may further include a host interface 413 and a memory interface 415. The host interface 413 may include a data exchange protocol between the memory system 400 and the host. The memory interface 415 may connect the memory controller 410 and the memory device 420. Furthermore, the memory controller 410 may further include an error correction code (ECC) block ECC 414. The ECC block 414 may detect and correct errors in data read from the memory device 420. Although not shown, the memory system 400 may further include a read-only memory (ROM) device configured to store code data required for interfacing with the host. In another case, the memory system 400 may be embodied by a solid-state disk (SSD) that may replace a hard disk of a computer system.

According to the present invention, memory cells can be downscaled in a row direction and a direction perpendicular to a semiconductor substrate, and back tunneling can be prevented during an erase operation of a semiconductor memory device.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A 3-dimensional non-volatile memory device, comprising:
    vertical channel layers protruding from a substrate;
    a plurality of interlayer insulating layers and a plurality of conductive layers alternately formed along the vertical channel layers;
    a charge trap layer surrounding the vertical channel layers, the charge trap layer having a smaller thickness in a plurality of first regions, interposed between the plurality of conductive layers and the vertical channel layers, than in a plurality of second regions, interposed between the plurality of interlayer insulating layers and the vertical channel layers, wherein the charge trap layer has an uneven structure; and
    a blocking insulating layer formed in each of the plurality of first regions, between the plurality of conductive layers and the charge trap layer.

2. The device of claim 1, wherein the blocking insulating layer is formed by oxidizing a portion of the charge trap layer.

3. The device of claim 1, wherein a thickness of the charge trap layer, in each of the plurality of second regions, is equal to the sum of the thickness of the charge trap layer, in each of the plurality of first regions and a thickness of the blocking insulating layer in each of the first regions.

4. The device of claim 1, wherein the conductive layers are word lines or selection lines.

5. The device of claim 1, wherein the conductive layers are formed of tungsten (W).

6. The device of claim 1, further comprising:
    a pipe gate formed between the plurality of interlayer insulating layers and the substrate; and
    a pipe channel layer to fill the pipe gate and connect a pair of the vertical channel layers.

7. A memory system comprising:
    a 3-dimensional non-volatile memory device, comprising:
    vertical channel layers protruding from a substrate, interlayer insulating layers and conductive layers alternately formed along the vertical channel layers, a charge trap layer surrounding the vertical channel layers, the charge trap layer having a smaller thickness in a plurality of first regions, interposed between the conductive layers and the vertical channel layers, than in a plurality of second regions, interposed between the interlayer insulating layers and the vertical channel layers, and a blocking insulating layer formed in each of the plurality of first regions, between the conductive layers and the charge trap layer; and
    a memory controller to control the 3-dimensional non-volatile memory device,
    wherein a thickness of the charge trap layer in each of the plurality of second regions, is equal to the sum of the thickness of the charge trap layer, in each of the plurality of first regions and a thickness of the blocking insulating layer in each of the first regions.

8. The device of claim 7, wherein the blocking insulating layer is formed by oxidizing a portion of the charge trap layer.

9. The device of claim 7, wherein the conductive layers are word lines or selection lines.

10. The device of claim 7, wherein the conductive layers are formed of tungsten (W).

11. The device of claim 7, further comprising:
    a pipe gate formed between the plurality of interlayer insulating layers and the substrate; and
    a pipe channel layer to fill the pipe gate and connect a pair of the vertical channel layers.

12. A method of manufacturing a 3-dimensional non-volatile memory device, the method comprising:
    alternately forming first interlayer insulating layers and first sacrificial layers on a substrate;
    forming channel holes, in the first interlayer insulating layers and first sacrificial layers, by etching the first interlayer insulating layers and the first sacrificial layers;
    sequentially forming a charge trap layer and a tunnel insulating layer on sidewalls of the channel holes;
    forming channel layers on each of the tunnel insulating layers;
    forming slits, in the first interlayer insulating layers and first sacrificial layers, by etching the first interlayer insulating layers and the first sacrificial layers;
    removing the first sacrificial layers exposed on inner walls of the slits;
    forming blocking insulating layers by oxidizing portions of the charge trap layers, exposed by removing the first sacrificial layers, to less than a full thickness of the charge trap layers; and
    forming conductive layers on each of the blocking insulating layers.

13. The method of claim 12, where the first sacrificial layers are formed of a material having an etch selectivity that is higher than an etch selectivity of the charge trap layer.

14. The method of claim 12, wherein the first sacrificial layers are formed of polysilicon (poly-Si).

15. The method of claim 12, wherein the removing the first sacrificial layers comprises:

performing an etching process, where an etch selectivity of the first sacrificial layers is higher than an etch selectivity of the charge trap layer.

16. The method of claim 12, wherein the charge trap layers are formed between the blocking insulating layers and the tunnel insulating layers.

17. The method of claim 12, further comprising:
forming an interlayer insulating layer on the substrate;
forming a first pipe gate on the interlayer insulating layer;
forming, by etching the first pipe gate, a trench connecting a pair of channel holes; and
filling the trench with a sacrificial layer; and
forming the first interlayer insulating layers and the first sacrificial layers on the first pipe gate.

18. The method of claim 17, wherein the forming the pipe gate further comprises:
forming a first pipe gate layer on the interlayer insulating layer; and
forming a second pipe gate layer on the first pipe gate layer, wherein the first pipe gate layer is filled with the sacrificial layer.

* * * * *